United States Patent
Kato

(10) Patent No.: US 8,305,763 B2
(45) Date of Patent: Nov. 6, 2012

(54) HOUSING CASE FOR ELECTRONIC CIRCUIT BOARD

(75) Inventor: Hiroshi Kato, Takanezawa-machi (JP)

(73) Assignee: Keihin Corporation, Shinjuku-Ku Tokyo (JP)

( * ) Notice: Subject to any disclaimer, the term of this patent is extended or adjusted under 35 U.S.C. 154(b) by 349 days.

(21) Appl. No.: 12/588,476

(22) Filed: Oct. 16, 2009

(65) Prior Publication Data
US 2010/0103632 A1    Apr. 29, 2010

(30) Foreign Application Priority Data

Oct. 27, 2008   (JP) ................... 2008-276081
Oct. 27, 2008   (JP) ................... 2008-276082

(51) Int. Cl.
H05K 5/00    (2006.01)
H05K 1/14    (2006.01)
H05K 1/18    (2006.01)
H05K 7/14    (2006.01)

(52) U.S. Cl. ........ 361/752; 361/730; 361/736; 361/748; 361/796; 361/800

(58) Field of Classification Search .................... 174/50; 312/223.1, 223.3; 361/730, 752, 796, 800, 361/679.01, 736, 748
See application file for complete search history.

(56) References Cited

U.S. PATENT DOCUMENTS

| | | | | |
|---|---|---|---|---|
| 4,361,350 A * | 11/1982 | Palloch et al. | ................. | 292/251 |
| 6,407,925 B1 * | 6/2002 | Kobayashi et al. | ........... | 361/752 |
| 6,628,523 B2 * | 9/2003 | Kobayashi et al. | ........... | 361/736 |
| 6,927,337 B2 * | 8/2005 | Kobayashi et al. | ........... | 174/535 |
| 2004/0235317 A1 | 11/2004 | Schiefer | | |
| 2006/0044768 A1 * | 3/2006 | Mizutani et al. | ............... | 361/752 |
| 2006/0250779 A1 * | 11/2006 | Huang | .......................... | 361/752 |
| 2007/0165424 A1 * | 7/2007 | Sakai | ............................ | 362/633 |
| 2008/0066956 A1 * | 3/2008 | Lawlyes et al. | ............... | 174/535 |
| 2008/0310131 A1 * | 12/2008 | Fino et al. | ..................... | 361/758 |

FOREIGN PATENT DOCUMENTS

| | | |
|---|---|---|
| JP | 541979-36569 | 3/1979 |
| JP | 1-67790 | 5/1989 |
| JP | 05-243758 | 9/1993 |
| JP | 2001-196767 | 7/2001 |

(Continued)

OTHER PUBLICATIONS

Decision to grant a patent, JP2008-276081, dated May 2, 2012 by Japanese Patent Office.

(Continued)

*Primary Examiner* — Timothy Thompson
*Assistant Examiner* — Sherman Ng
(74) *Attorney, Agent, or Firm* — Lau & Associates

(57) ABSTRACT

In a housing case for housing an electronic circuit board, comprising a case body, a cover, a pedestal formed on the case body to support the board, a holder formed on the cover at a location to face the pedestal to hold the board from opposite side of the pedestal, a recess formed at the case body near the pedestal, and a convex formed on the cover at a position corresponding to the recess, it is configured such that the convex is inserted in and adhered to the recess to attach the cover to the case body. With this, it becomes possible to change the amount of adhesive member in accordance with the environment, etc., with the simple structure.

9 Claims, 7 Drawing Sheets

FOREIGN PATENT DOCUMENTS

| | | |
|---|---|---|
| JP | 2001-244656 | 7/2001 |
| JP | 2003-258451 | 9/2003 |
| JP | 2003-258451 | 12/2003 |
| JP | 2004-274954 | 9/2004 |
| JP | 2005-513805 | 5/2005 |
| JP | 2006-156217 | 6/2006 |

OTHER PUBLICATIONS

Notification of Grounds for Rejection for Japanese Application No. JP2008-276082 dated May 2, 2012, English translation with original Japanese text.

* cited by examiner

HOUSING CASE FOR ELECTRONIC CIRCUIT BOARD

BACKGROUND OF THE INVENTION

1. Field of the Invention

The present invention relates to a housing case for an electronic circuit board, more particularly to a housing case that houses an electronic circuit board in a space formed by a case body and cover.

2. Description of the Related Art

Since a housing case for an electronic circuit board is generally used in an environment where water and oil components may fly and adhere thereto or a dusty environment, it is necessary to enhance waterproof and dust resistance properties by hermetically sealing a space for housing the board. There is widely known a technique to bond a case body and cover using adhesive so as to seal the space.

An amount of adhesive used for bonding the case body and cover varies depending on an environment of the housing case, a type of adhesive or the like. Specifically, when the housing case is installed in an environment where relatively many water components fly, adhesive should be increased to enhance waterproof property, while, in the case of relatively few flying water components, a small amount of adhesive suffices.

Therefore, it is preferable that a housing case for an electronic circuit board is configured to be able to change an amount of adhesive in accordance with the environment for enhancing waterproof property, etc. In the technique taught in Japanese Laid-Open Patent Application No. 2003-258451, a housing case is installed with a base supporting a board and the height of the base is set in accordance with the environment, so that a gap applied or provided with adhesive (a gap for sealing) can be variable, thereby changing an amount of the adhesive.

However, in the reference, since the height of the base, i.e., the amount of the adhesive (precisely, a gap for sealing) is adjustable only within the height of the board, it may not satisfy a demand to further enhance waterproof property by using a relatively great amount of adhesive. Also, when the height of the base is adjusted, it causes the need to adjust the height of a positioning pin used to determine a position of the board, resulting in complex in the structure.

SUMMARY OF THE INVENTION

Therefore, an object of the present invention is to solve the above-described drawbacks and to provide a housing case for an electronic circuit board which can change an amount of adhesive in accordance with the environment, etc., with the simple structure, thereby enhancing waterproof and dust resistance properties.

In order to achieve the object, the present invention provides a housing case for housing an electronic circuit board on which components are mounted, comprising a case body adapted to form a space that houses the board; a cover adapted to form the space with the case body; a pedestal formed on the case body to support the board; a holder formed on the cover at a location to face the pedestal to hold the board from opposite side of the pedestal; a recess formed at the case body near the pedestal; and a convex formed on the cover at a position corresponding to the recess, and the convex is inserted in and adhered to the recess to attach the cover to the case body.

BRIEF DESCRIPTION OF THE DRAWINGS

The above and other objects and advantages of the invention will be more apparent from the following description and drawings in which.

DETAILED DESCRIPTION OF THE PREFERRED EMBODIMENTS

A housing case for an electronic circuit board according to embodiments of this invention will now be explained with reference to the attached drawings.

Figure 1:
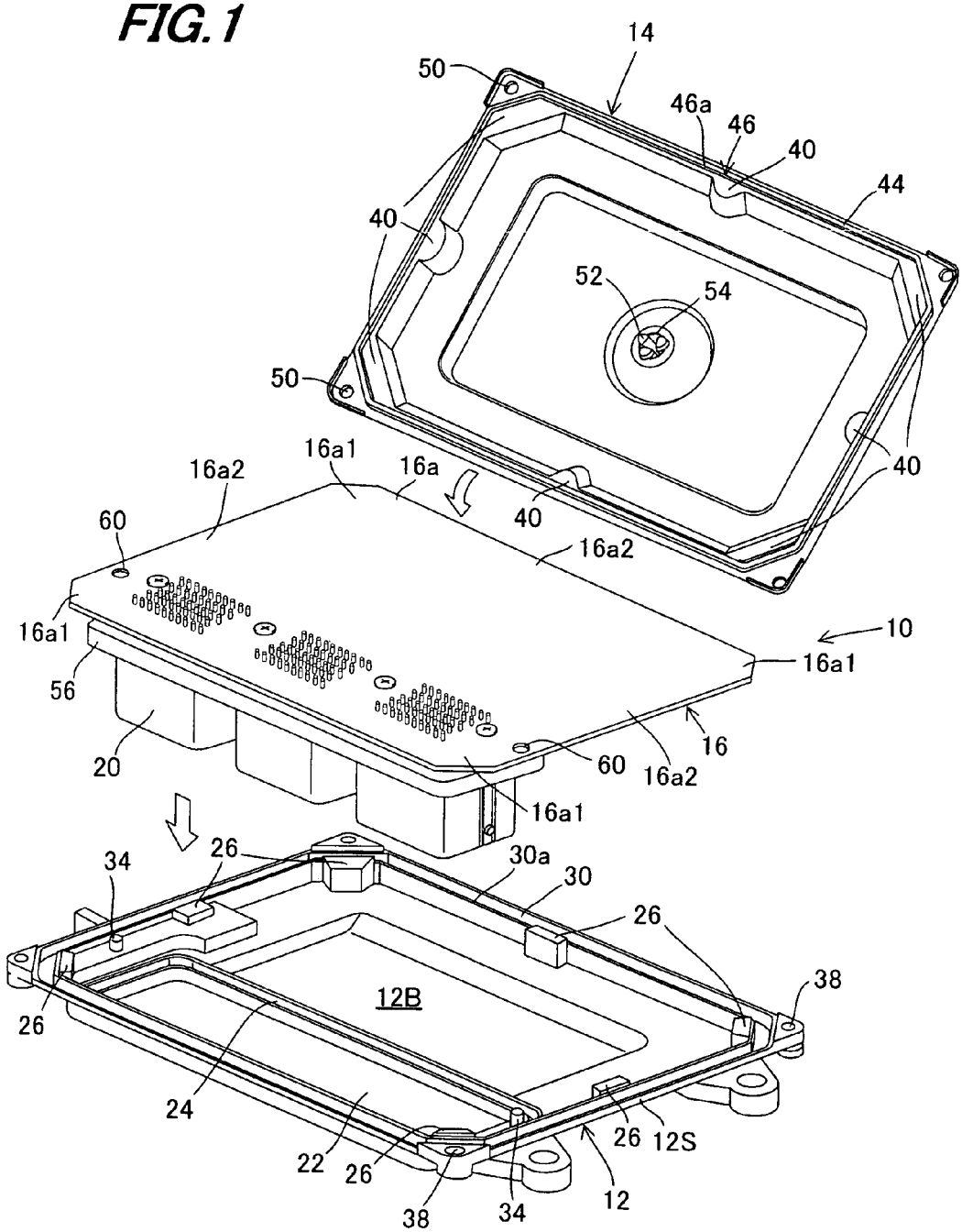
FIG. 1 is an overall exploded perspective view of a housing case for an electronic circuit board according to a first embodiment of this invention.
Figure 2:
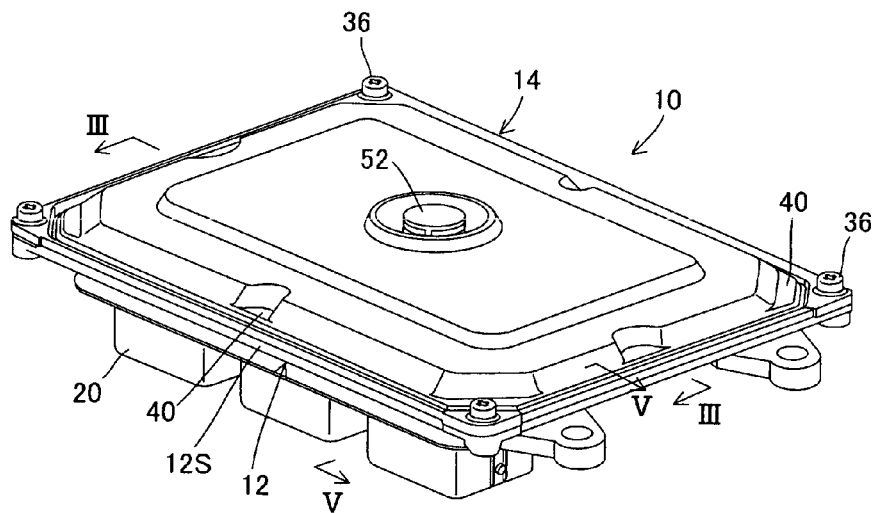
FIG. 2 is a perspective view of the housing case shown in FIG. 1 in the completed condition.

FIG. 1 is an overall exploded perspective view of a housing case for an electronic circuit board according to a first embodiment and FIG. 2 is a perspective view of the housing case shown in FIG. 1 in the completed or assembled condition.

In FIGS. 1 and 2, a reference numeral 10 designates the housing case for the electronic circuit board. The housing case 10 is mounted at, for example, an appropriate position in a vehicle (not shown) and, as clearly shown in FIG. 1, comprises a case body 12 and a cover 14 to be attached thereto. The electronic circuit board 16 is housed in a space formed by the case body 12 and cover 14.

In FIG. 1, the cover 14 is shown so that the inside surface thereof (i.e., a surface to be the internal side or to face to the case body 12 when the housing case 10 is in the completed condition) can be seen, for ease of understanding. Electronic components installed on the board 16 are omitted except a connector 20, for ease of illustration.

The case body 12 and cover 14 are made of a heat-conductive metal material such as zinc, aluminum, copper, iron, etc., and formed through pressing, cutting or die-casting process. The case body 12 has a bottom surface 12B having a substantially rectangular shape in a plan view and a side surface (side wall) projected upward (in) the direction toward the cover 14) from the edge of the bottom surface 12B.

The bottom surface 12B of the case body 12 is provided with an opening 22 of a rectangular shape. The opening 22 is called the "connector opening" since the connector 20 is inserted through the opening 22 (explained later). A recess (groove; called the "connector recess") 24 having predetermined width and depth is formed along the entire circumference of the connector opening 22 on the side facing the board 16.

A plurality of, i.e., seven pedestals (bases) 26 which locally or partially support the edge 16a of the board 16 are formed on the bottom surface 12B in the vicinity of the side surface 12S. Specifically, the pedestals 26 are formed near the four corners of the bottom surface 12B and the midpoints of the sides thereof (except one side near a long side of the connector opening 22). With this, the edge 16a of the board 16 is locally supported by the pedestals 26 at the corners 16a1 and the midpoints 16a2 of the sides.

A recess (groove; called the "cover recess") 30 having predetermined width and depth is formed in the vicinity of the pedestals 26 at the upper portion of the side surface 12S (a portion to abut on the cover 14) along the entire circumference of the case body 12.

Figure 3:
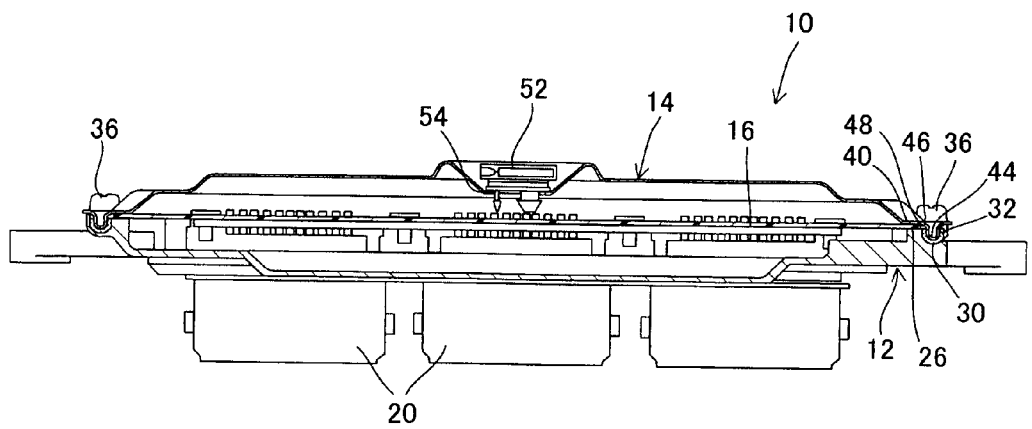
FIG. 3 is a cross-sectional view taken along line of FIG. 2.
Figure 4:
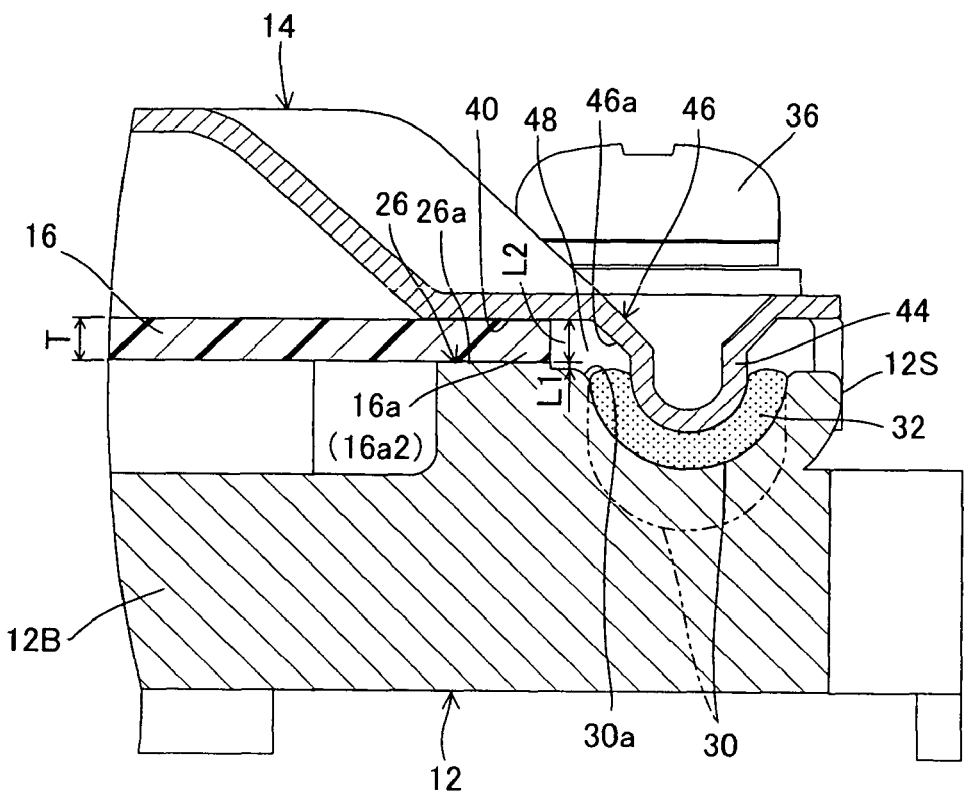
FIG. 4 is an enlarged sectional view showing a region where a case body of the housing case shown in FIG. 3 abuts on a cover thereof.

FIG. 3 is a cross-sectional view taken along line of FIG. 2 and FIG. 4 is an enlarged sectional view showing a region where the case body 12 shown in FIG. 3 abuts on the cover 14.

As clearly shown in FIG. 4, the cover recess 30 has a circular or horseshoe shape which is protruded downward viewed in cross-section and is formed near the pedestals 26, i.e., continuously with each of the pedestals 26. An open end 30a of the cover recess 30 is formed to be lower (in the direction toward the bottom surface 12B) than the pedestal 26 (i.e., its contact surface 26a that contacts the board 16) by a predetermined amount (e.g., about 1 or 2 millimeters; indicated by L1 in FIG. 4). The cover recess 30 is installed or applied with adhesive agent (adhesive member; hereinafter called the "adhesive") 32 for bonding the cover 14, which will be explained later. The width and depth of the cover recess 30 can be changed in accordance with an environment of the housing case 10, a type of the adhesive 32 or the like.

Returning to the explanation of FIG. 1, a plurality of, i.e., two positioning pins 34 used to determine a position of the board 16 are projected at appropriate positions of the case body 12, precisely near the connector opening 22. Each of the pins 34 is formed to be reduced in diameter toward the tip, i.e., has a tapered shape. The corners of the case body 12 are bored with screw holes (fixing members) 38 through which screws (fixing members) 36 (not shown in FIG. 1; shown in FIG. 2, etc.) are inserted and tightened for fixing the board 16 between the pedestals 26 and holders (explained later) of the cover 14, while fixing the cover 14 to the case body 12.

The cover 14 is elastically deformable and has a substantially rectangular shape in a plan view. A plurality of, i.e., eight holders 40 used for holding the board 16 from the opposite side of the pedestals 26 (from the upper side in the drawing) are formed on the cover 14 at positions to face the pedestals 26 when the cover 14 is fixed to the case body 12, i.e., positions near the four corners of the cover 14 and the midpoints of the four sides thereof.

The number of the holders 40 of the cover 14 is eight, while that of the pedestals 26 of the case body 12 is seven, so as to facilitate attachment of the cover 14 to the case body 12. Specifically, since the holders 40 are provided at the four corners of the cover 14 and the midpoints of the four sides thereof, the cover 14 can be symmetrical in the longitudinal and lateral directions in a plan view and hence, an assembler can easily attach the cover 14 to the case body 12 without taking orientation of the cover 14 into consideration.

A distance L2 (shown in FIG. 4) between the pedestals 26 and holders 40 are set to be identical or substantially identical with thickness T of the board 16 under condition where the housing case 10 assembly is completed (i.e., the cover 14 is fixed to the case body 12).

A convex (called the "cover convex") 44 to be inserted in the cover recess 30 is formed or projected at the edge of the cover 14 (a portion to abut on the case body 12) along the entire circumference. Specifically, the cover convex 44 of the cover 14 is formed at a position corresponding to the cover recess 30. As clearly shown in FIG. 4, the cover convex 44 has a circular or horseshoe shape which is protruded downward viewed in cross-section.

The cover 14 is further formed with a movement restriction member 46 that restricts movement of the board 16, as shown in FIGS. 1, 4, etc. The restriction member 46 is formed continuously with the holders 40 and cover convex 44, as can be seen in FIG. 4, and is provided with an inclined surface 46a of a tapered shape that is formed at a position between the holders 40 and cover convex 44 so as to contact the board 16.

Owing to this configuration, even when the board 16 is moved rightward (in FIG. 4) due to vibration from the exterior or the like, the edge 16a of the board 16 contacts the inclined surface 46a of the restriction member 46 and stops, i.e., the movement is restricted by the restriction member 46. Further, since the restriction member 46 is provided with the inclined surface 46a, a gap 48 is formed among the inclined surface 46a, board 16 and case body 12 when the housing case 10 assembly is completed.

As shown in FIG. 1, the four corners of the cover 14 are bored with screw through-holes (fixing members) 50 through which the screws are inserted. A water repellent filter (water/oil repellent filter which does not pass liquid but passes air) 52 is attached to a vent 54 at or near the center of the cover 14 to ensure breathability of the housing case 10, which will not be explained here because it is not directly related to the gist of this invention.

The electronic components including the connector 20 are mounted on the board 16 by soldering. The connector 20 has three blocks and the outer walls thereof are made of an elastically deformable resin material such as polybutylene terephthalate (PBT) or the like.

Figure 5:
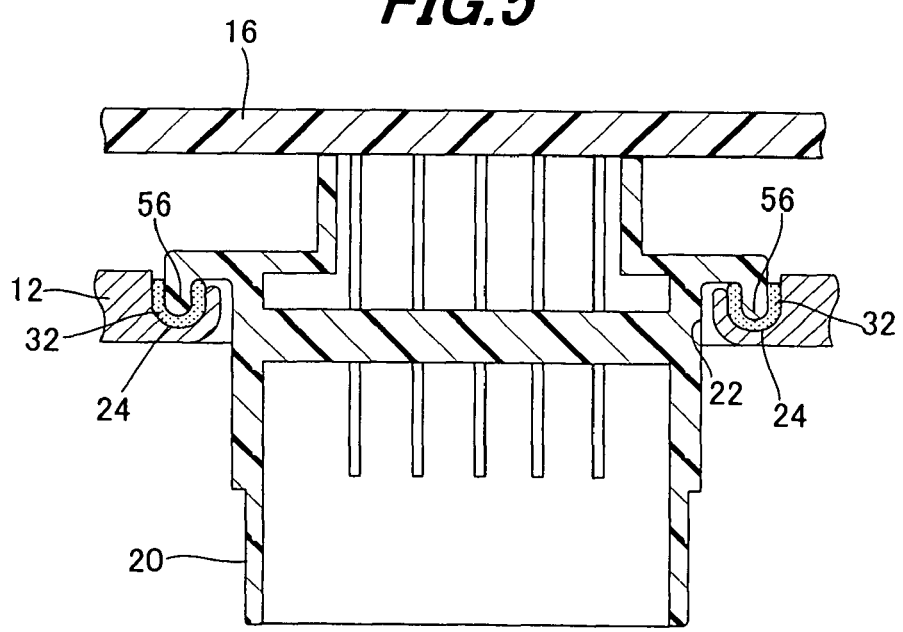
FIG. 5 is a cross-sectional view taken along line V-V of FIG. 2.

FIG. 5 is a cross-sectional view taken along line V-V of FIG. 2. For ease of illustration, the cover 14 is omitted in FIG. 5.

As shown in FIGS. 1 and 5, a convex (called the "connector convex") 56 to be inserted in the connector recess 24 is formed at a position to abut on the case body 12 along the circumference of the connector 20. Specifically, the connector convex 56 is formed continuously with the outer walls of the three blocks of the connector 20 to surround the blocks. Thus, the connector convex 56 is formed at a position corresponding to the connector recess 24.

Similarly to the cover recess 30, the connector recess 24 has a circular or horseshoe shape which is protruded downward viewed in cross-section, as clearly shown in FIG. 5, and is installed or applied with the adhesive 32 for bonding the connector 20 (explained later).

As shown in FIG. 1, a plurality of, i.e., two positioning holes (positioning through-holes) 60 through which the positioning pins 34 are inserted are bored at appropriate positions of the board 16, precisely positions near the connector 20 and corresponding to the positioning pins 34. The positioning hole 60 is greater in diameter than the positioning pin 34.

The assembly of the housing case 10 will be explained. First, the board 16 is attached to the case body 12. Specifically, an adequate amount of the adhesive 32 having elasticity (hardness of which after hardened is low), such as silicon adhesive, is installed or applied to the connector recess 24 of the case body 12. Then the board 16 is disposed so that a surface mounted with the electronic components contacts the pedestals 26 of the case body 12 to be supported by the pedestals 26. The edge 16a of the board 16 is locally supported by the pedestals 26 (at the corners 16a1 and the midpoints 16a2 of the sides), as explained above.

When the board 16 is placed on the pedestals 26, the positioning pins 34 of the case body 12 are inserted into the positioning holes 60 of the board 16, thereby easily positioning the board 16 relative to the case body 12.

When the board 16 is supported by the pedestals 26, the connector 20 mounted on the board 16 is protruded toward the exterior of the case body 12 through the connector opening 22, while the connector convex 56 is inserted in the connector recess 24. As shown in FIG. 5, the connector convex 56 is adhered to the connector recess 24 by the adhesive 32 so as to seal the connector opening 22.

After the board 16 is attached to the case body 12, the cover 14 is attached to the case body 12. Specifically, an adequate amount of the adhesive 32 is installed or applied to the cover recess 30 of the case body 12. The amount of the adhesive 32 to be applied to the cover recess 30 is changed in accordance with the size (width and depth) of the cover recess 30 and a type of the adhesive.

Then, as shown in FIG. 4, the cover convex 44 is inserted into the cover recess 30. As a result, the cover convex 44 is adhered to the cover recess 30 by the adhesive 32 so as to seal a space housing the board 16.

Although the adhesive 32 applied to the cover recess 30 may spill over the open end 30a when the cover convex 44 is inserted into the cover recess 30, the spilled adhesive 32 flows into the gap 48 formed among the inclined surface 46a, board 16 and case body 12, so that the gap 48 is sealed. As a result, the space housing the board 16 can be sealed more firmly.

Following to the above process, the screws 36 are inserted into the screw holes 38 through the screw through-holes 50 and tightened to fix the cover 14 to the case body 12. Since the distance L2 between the pedestals 26 of the case body 12 and the holders 40 of the cover 14 is (substantially) identical with the thickness T of the board 16, the edge 16a of the board 16 is locally held and fixed (at the corners 16a1 and the midpoints 16a2 of the sides) between the pedestals 26 and holders 40.

Thus the cover convex 44 is inserted in the cover recess 30 and adhered by the adhesive 32 to attach the cover 14 to the case body 12, while fixing the board 16 between the pedestals 26 and holders 40. The housing case 10 assembly is completed in this manner.

As stated above, the first embodiment is configured to have the housing case 10 for the electronic circuit board 16, comprising: the case body 12, the cover 14, the pedestal(s) 26 formed on the case body to support the board 16; the holder(s) 40 formed on the cover at a location to face the pedestal to hold the board 16 from opposite side of the pedestal; the cover recess 30 formed at the case body, and the cover convex 44 formed on the cover, and the cover convex 44 is inserted in and adhered to the cover recess 30 to attach the cover 14 to the case body 12. With this, it becomes possible to change the amount of adhesive member in accordance with the environment, etc., with the simple structure, to be specific, only by varying the size (width and depth) of the cover recess 30 which is applied with the adhesive 32.

Specifically, when the housing case 10 is installed in an environment where relatively many water components fly, the amount of the adhesive 32 can be increased by increasing the depth of the cover recess 30, as indicated by an imaginary line in FIG. 4, thereby enhancing waterproof property. On the other hand, when the housing case 10 is installed in an environment where relatively few water components fly, although not illustrated, the amount of the adhesive 32 can be reduced by decreasing the depth of the cover recess 30, thereby simplifying the structure related to waterproof property and achieving the decrease in cost.

Also, since the cover convex 44 is inserted in and adhered to the cover recess 30 to attach the cover 14 to the case body 12, the space housing the board 16 can be firmly sealed, thereby enhancing waterproof and dust resistance properties.

The housing case 10 further includes the adhesive 32 applied to the recess 30, and the cover convex 44 is inserted in the cover recess 30 to be adhered by the adhesive 32 to attach the cover 14 to the case body 12. With this, the space housing the board 16 can be sealed more firmly, thereby further enhancing waterproof and dust resistance properties.

The housing case 10 further includes the movement restriction member 46 formed on the cover 14 to restrict movement of the board 16. With this, it becomes possible to restrict movement of the board 16 caused by vibration or the like, thereby effectively preventing deflection, etc., of the board 16.

In the housing case 10, the movement restriction member 46 is provided with the inclined surface 46a that is formed at a position between the holder 40 and the cover convex 44 so as to contact the board 16 such that the gap 48 is formed among the inclined surface 46a, the board 16 and the case body 12. With this, it becomes possible to easily form the cover convex 44 (through a drawing process). Also, since the adhesive 32 spilled over the cover recess 30 flows into the gap 48, the gap 48 can be sealed, thereby further enhancing waterproof and dust resistance properties.

In the housing case 10, since the open end 30a of the cover recess 30 is formed to be lower than the pedestal 26 by the predetermined amount L1, it becomes possible to form the cover recess 30 of the case body 12 in the vicinity of the pedestals 26 and accordingly, the housing case 10 can be compact.

In the housing case 10, since the screws 36 and the like fix the board 16 between the pedestals 26 and the holders 40, in other words, movement of the board 16 is restricted. With this, even when vibration to the housing case 10 from the exterior or thermal stress to the board 16 occurs, it becomes possible to prevent deflection, etc., of the board 16.

In the housing case 10, since the pedestals 26 are formed to support the edge 16a of the board 16 at positions near the corners 16a1 and the midpoints 16a2 of the sides, the board 16 can be stably installed on the pedestals 26.

In the housing case 10, since the distance L2 between the pedestal 26 and the holder 40 is set to be identical or substantially identical with thickness T of the board 16 when the cover 14 is attached to the case body 12, the board 16 can be securely held and fixed between the pedestals 26 and holders 40.

In the housing case 10, since adhesive member is the adhesive agent 32, the cover convex 44 can be easily adhered to the cover recess 30.

In the housing case 10, the fixing members include the screw 36, screw hole 38 bored in the case body 12, and screw through-hole 50 bored in the cover 14, and the screw 36 is inserted into the screw hole 38 through the screw through-hole 50 and tightened to fix the cover 14 to the case body 12 such that the board 16 is fixed between the pedestals 26 and the holders 40. With this, the board 16 can be securely fixed between the pedestals 26 and holders 40 with the simple structure.

In the housing case 10, since the cover recess 30 is formed at an upper portion of the side surface 12S of the case body 12 along entire circumference of the case body 12, the space housing the board 16 can be sealed more firmly, thereby further enhancing waterproof and dust resistance properties.

Since the housing case 10 further includes the positioning pin 34 formed at the case body 12 and positioning through-hole 60 bored at the board 16, the board 16 can be easily positioned as desired.

Figure 6:
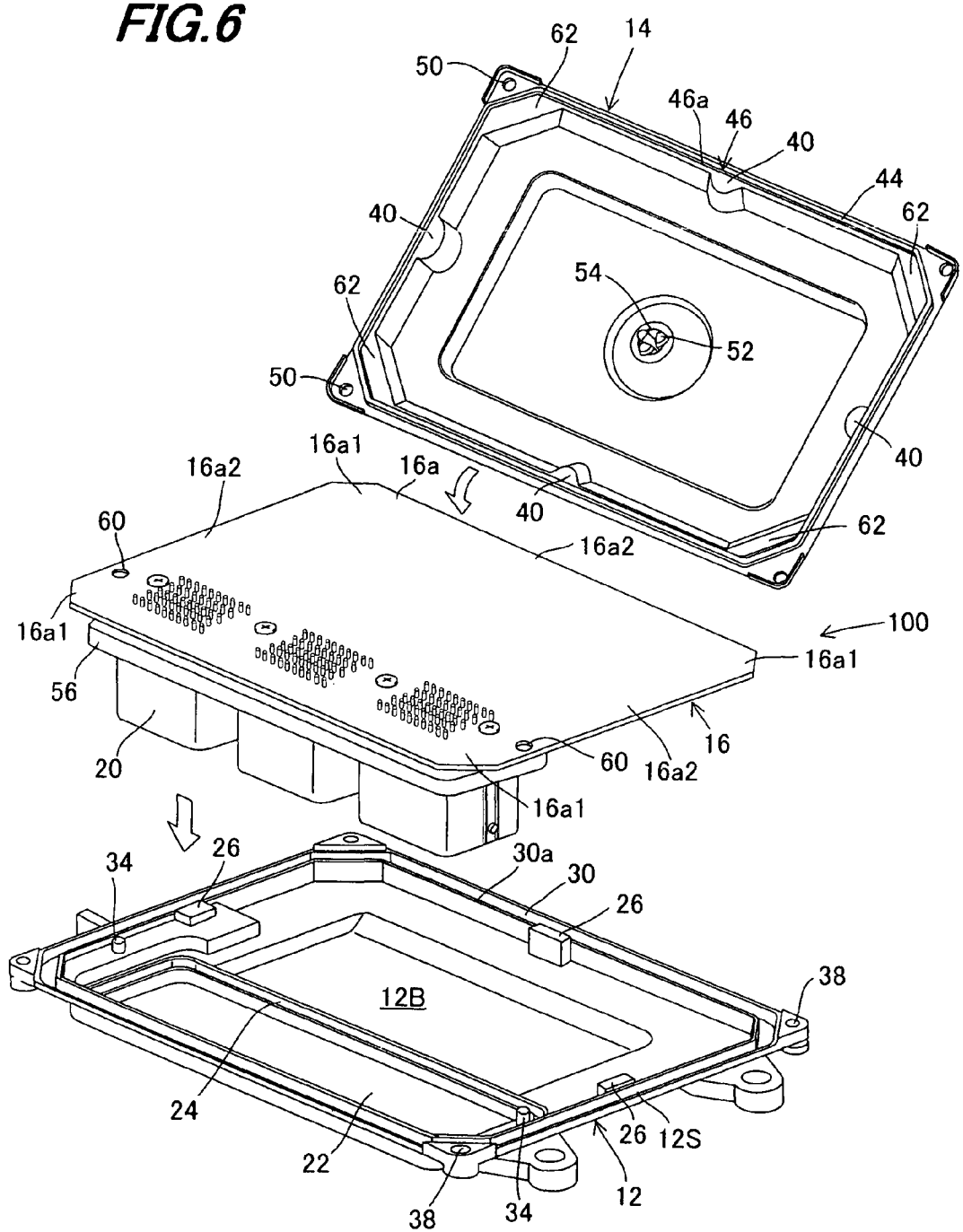
FIG. 6 is an overall exploded perspective view similar to FIG. 1, but showing a housing case for an electronic circuit board according to a second embodiment of this invention.
Figure 7:
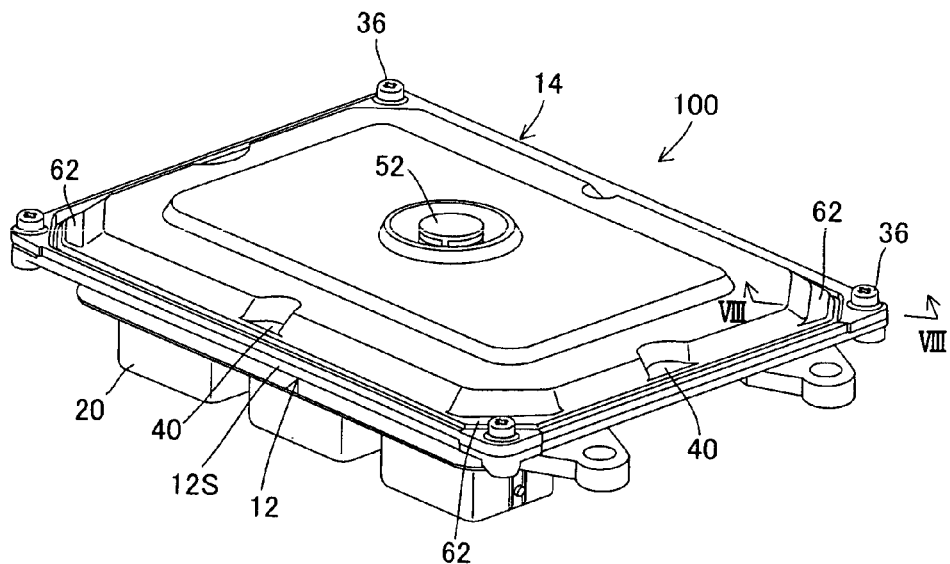
FIG. 7 is a perspective view similar to FIG. 2, but showing the housing case shown in FIG. 6 in the completed condition.

FIG. 6 is an overall exploded perspective view of a housing case 100 for an electronic circuit board according to a second embodiment and FIG. 7 is a perspective view of the housing case 100 shown in FIG. 6 in the completed condition. Constituent elements corresponding to those of the first embodiment are assigned by the same reference symbols and will not be explained.

The explanation will be made with focus on points of difference from the first embodiment. In the second embodiment, the pedestals 26 formed at the four corners of the bottom surface 12B of the case body 12 and the holders 40 formed at the four corners of the cover 14 in the first embodiment are removed and press members 62 are provided in place of the removed holders 40.

The explanation will be made in detail. A plurality of i.e., three pedestals 26 which locally or partially support the edge 16a of the board 16 are formed on the bottom surface 12B in the vicinity of the side surface 12S. Specifically, the pedestals 26 are formed at positions other than the four corners of the bottom surface 12B, i.e., formed near the midpoints of the sides of the bottom surface 12B (except one side near a long side of the connector opening 22). With this, the edge 16a of the board 16 is locally supported by the pedestals 26 at the locations other than the corners 16a1 (i.e., at the midpoints 16a2 of the sides).

A plurality of, i.e., four holders 40 are formed on the cover 14 at locations to face the pedestals 26 when the cover 14 is fixed to the case body 12, precisely locations other than the four corners of the cover 14, i.e., near the midpoints of the four sides thereof. The number of the pedestals 26 is different from that of the holders 40 for the reason described in the first embodiment.

A plurality of, i.e., four press members 62 for pressing the corners 16a1 of the edge 16a of the board 16 are formed on the cover 14 at positions distant from the holders 40, specifically near the four corners of the cover 14.

Figure 8:
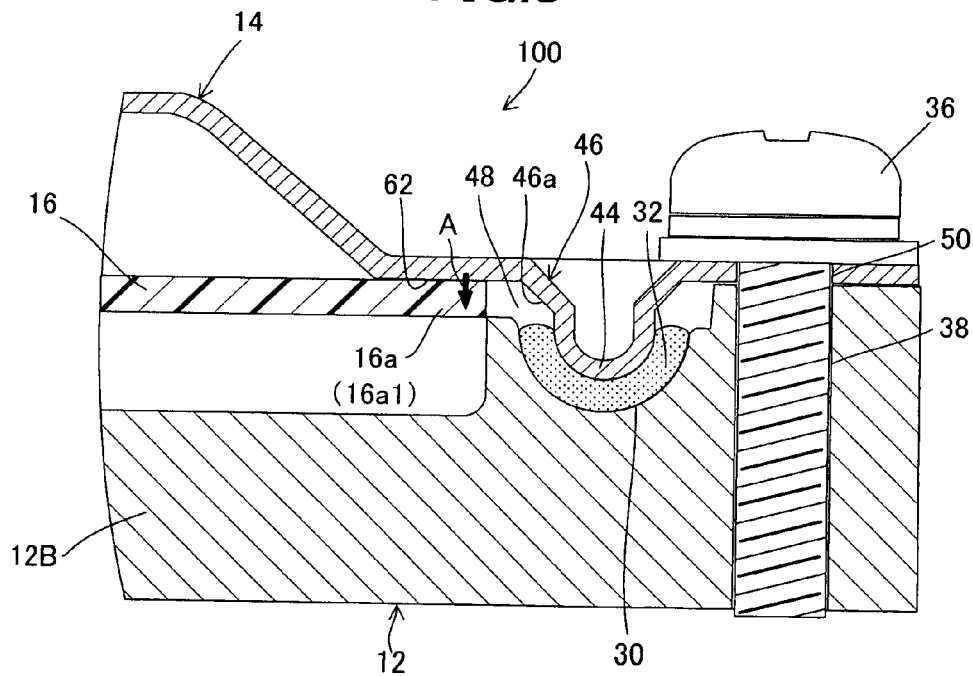
FIG. 8 is a cross-sectional view taken along line VIII-VIII of FIG. 7.

FIG. 8 is a cross-sectional view taken along line VIII-VIII of FIG. 7.

Since the pedestals 26 are not provided at positions corresponding to the press members 62, the edge 16a of the board 16 is pressed at its corners 16a1 toward the case body 12 (downward in the drawing; indicated by an arrow A) by the pressing members 62 when the cover 14 is attached to the case body 12, as shown in FIG. 8.

Thus, the pressing members 62 which locally press the edge 16a, i.e., the corners 16a1 of the board 16 are formed on the cover 14 at positions distant from the holders 40.

The assembly of the housing case 100 is conducted as described in the first embodiment. The edge 16a of the board 16 is locally fixed between the pedestals 26 and holders 40 (at the midpoints 16a2 of the sides). The cover convex 44 is inserted into the cover recess 30 and adhered by the adhesive 32 to attach the cover 14 to the case body 12, while the edge 16a (i.e., the corners 16a1) is locally pressed by the pressing members 62 of the cover 14. The housing case 10 assembly is completed in this manner.

Figure 9:
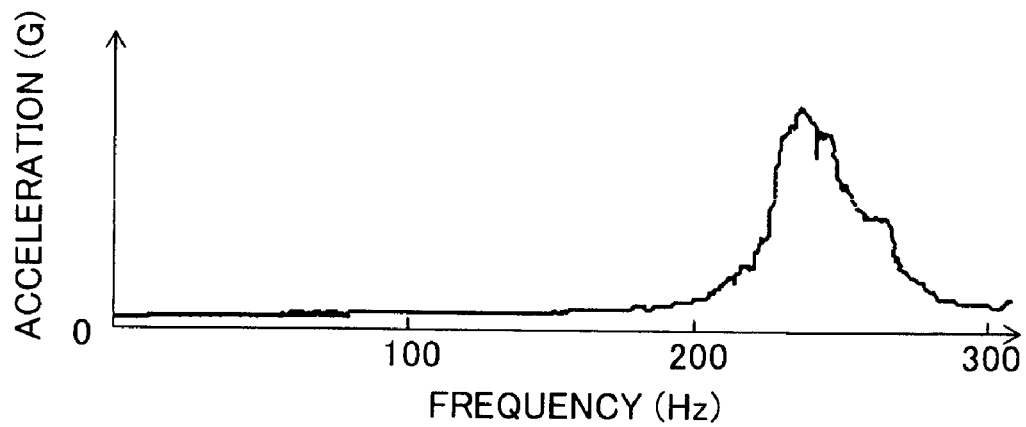
FIG. 9 is a graph showing vibration characteristics of the board in the housing case shown in FIG. 6 with respect to vibration from the exterior.
Figure 10:
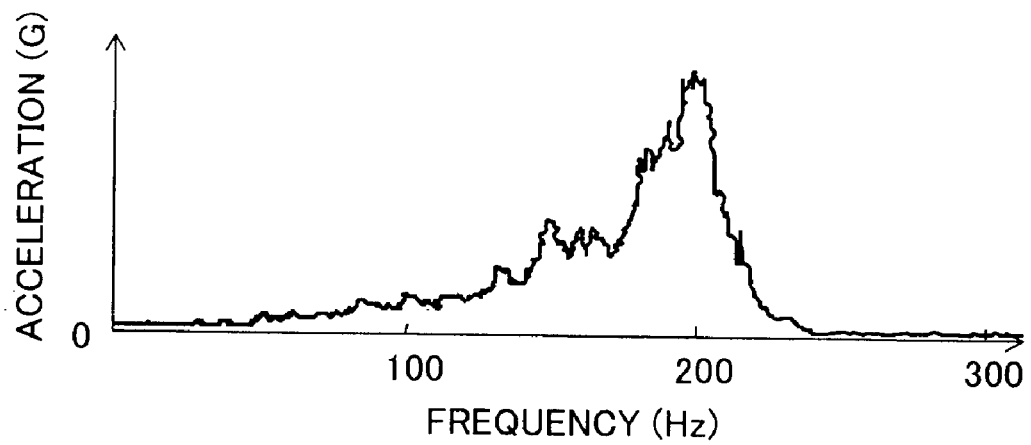
FIG. 10 is a graph similar to FIG. 9, but showing vibration characteristics of the board in a housing case when the board is fixed at seven positions between pedestals and holders.

FIG. 9 is a graph showing vibration characteristics of the board 16 in the housing case 100 with respect to vibration from the exterior. FIG. 10 is a graph similar to FIG. 9, but showing vibration characteristics of the board 16 in a housing case when the pedestals 26 are additionally provided at the four corners (i.e., locations corresponding to the pressing members 62) of the case body 12 similarly to the housing case 10 according to the first embodiment, so that the edge 16a of the board 16 is fixed at seven positions between the pedestals 26 and holders 40.

An acceleration sensor that produces an output or signal indicative of acceleration in the gravitational or vertical direction is installed at or near the center of the board 16. FIGS. 9 and 10 show output values of the acceleration sensor when vibration of about 5 G vibration acceleration is applied to each housing case to vary frequency (number of vibration).

In the housing case in which the board 16 is fixed at seven positions, as shown in FIG. 10, the output value of the acceleration sensor (i.e., vibration of the board 16) is gradually increased after the frequency exceeds 150 Hz and a resonance arises when the frequency is 200 Hz or thereabout.

In contrast, in the housing case 100 configured so that the midpoints 16a2 are fixed at three positions between the pedestals 26 and holders 40 and the corners 16a1 are pressed by the press members 62, as shown in FIG. 9, the output value of the acceleration sensor does not exhibit a great change until the frequency reaches 200 Hz and a resonance arises after the frequency exceeds 200 Hz (precisely, at or about 250 Hz). Thus, the housing case 100 according to the second embodiment enables to move a resonance point to the high frequency side (at or above 200 Hz) and suppress variation of the output value on the low frequency side (below 200 Hz).

As stated above, the second embodiment is configured to include the fixing members (screw 36, screw hole 38, screw through-hole) that fix the board 16 between the pedestals 26 and the holders 40; and the pressing members 62 that are formed on the cover 14 at positions distant from the holders 40 and locally press an edge of the board 16, and the pedestals 26 locally support the edge of the board 16, in other words, the edge 16a of the board 16 is locally fixed between the pedestals 26 of the case body 12 and the holders 40 of the cover 14, while locally pressed by the pressing members 62 formed at positions distant from the holders 40. With this, even when vibration is transmitted to the housing case 100 from the exterior, vibration of the board 16 can be suppressed due to the pressing members 62 of the cover 14, i.e., due to the elasticity of the cover 14, thereby decreasing stress (caused by the vibration, etc.) to be applied to the board 16. Since deflection of the board 16 is prevented, a soldered portion can avoid generation of a crack.

In the housing case 10, the pedestals 26 are formed to support the edge 16a of the board 16 at positions other than the corners 16a1. With this, it becomes possible to securely support the edge 16a of the board 16 by the pedestals 26, and form the pressing members 62 at the positions distant from the holders 40 to press the edge 16a at the corners 16a1. Accordingly, vibration of the board 16 can be effectively suppressed through the pressing members 62, thereby reliably decreasing stress to be applied to the board 16.

In the housing case 10, the pressing members 62 are formed to press the edge 16a of the board 16 at the corners 16a1. With this, vibration of the board 16 can be more effectively suppressed through the pressing members 62, thereby further reliably decreasing stress to be applied to the board 16. The remaining configuration is the same as that in the first embodiment.

Figure 11:
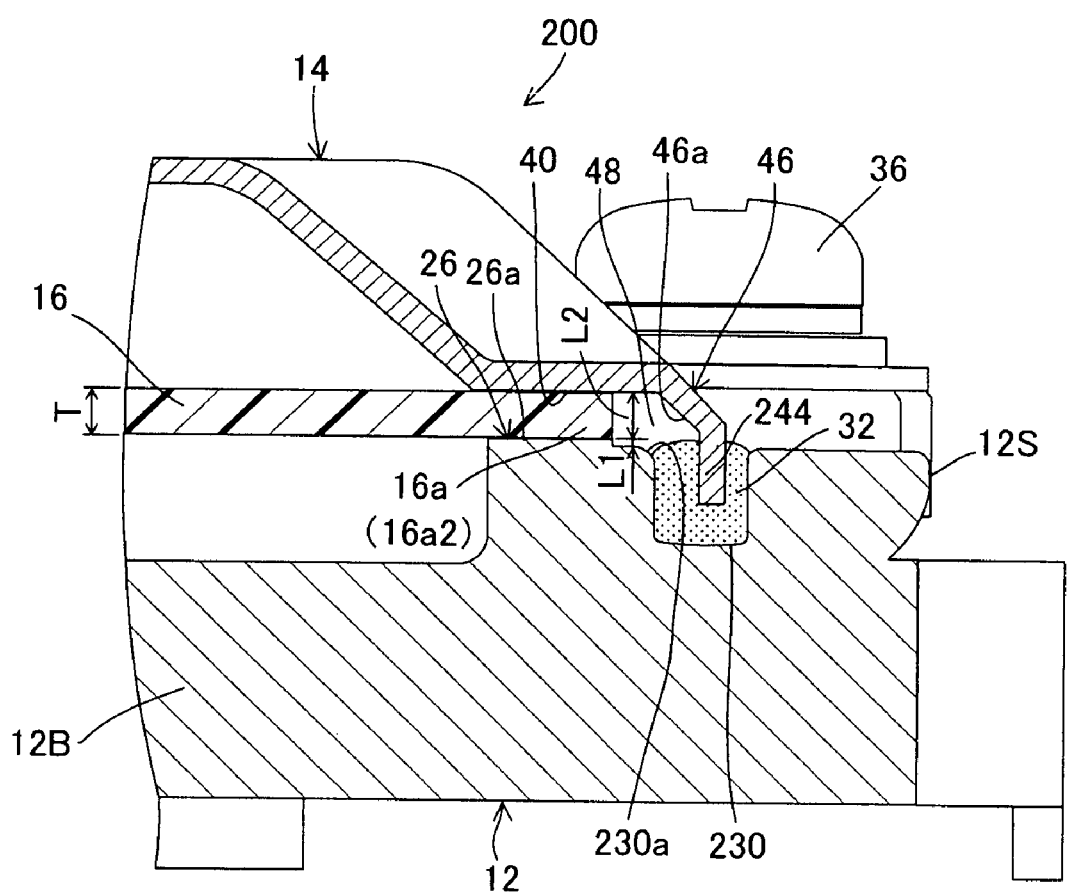
FIG. 11 is an enlarged sectional view similar to FIG. 4, but showing a region where a case body of a housing case for an electronic circuit board according to a third embodiment of this invention abuts on a cover thereof.

FIG. 11 is an enlarged sectional view similar to FIG. 4, but showing a region where the case body 12 of a housing case 200 for an electronic circuit board according to a third embodiment abuts on the cover 14. Constituent elements corresponding to those of the first embodiment are assigned by the same reference symbols and will not be explained.

The explanation will be made with focus on points of difference from the first embodiment. In the third embodiment, as shown in FIG. 11, a cover recess 230 has a substantially rectangular shape in cross-section. One end (i.e., the opposite side of the other end formed continuously with the holders 40) of the movement restriction member 46 is extended downward to form an end edge of the cover 14 and the end edge functions as a cover convex 244 to be inserted in the cover recess 230.

Owing to the above configuration, the housing case 200 according to the third embodiment can achieve further simple structure of the cover convex 244 and cover recess 230. The remaining configuration is the same as that in the first embodiment.

As set out in the foregoing, the first to third embodiments are configured to have a housing case (10) for housing an electronic circuit board (16) on which components are mounted, comprising: a case body (12) adapted to form a space that houses the board; a cover (14) adapted to form the space with the case body; a pedestal(s) (26) formed on the case body to support the board; a holder(s) (40) formed on the cover at a location to face the pedestal to hold the board from opposite side of the pedestal; a recess (cover recess 30, 230) formed at the case body near the pedestal; and a convex (cover convex 44, 244) formed on the cover at a position corresponding to the recess, and the convex is inserted in and adhered to the recess to attach the cover to the case body.

The housing case further includes an adhesive member (adhesive agent 32) applied to the recess, and the convex is inserted in the recess to be adhered by the adhesive member to attach the cover to the case body.

The housing case further includes a movement restriction member (46) formed on the cover to restrict movement of the board.

In the housing case, the movement restriction member is provided with an inclined surface (46a) that is formed at a position between the holder and the convex so as to contact the board such that a gap (48) is formed among the inclined surface, the board and the case body.

In the housing case, an open end (30a, 230a) of the recess is formed to be lower than the pedestal by a predetermined amount (L1).

The housing case further includes a plurality of fixing members (screw 36, screw hole 38, screw through-hole 50) that fix the board between the pedestal and the holder.

In the housing case, the pedestals are formed to support an edge (16a) of the board at positions near corners (16a1) and midpoints (16a2) of sides.

The housing case according to the second embodiment further includes a plurality of fixing members (screw 36, screw hole 38, screw through-hole 50) that fix the board between the pedestals and the holders; and a plurality of pressing members (62) that are formed on the cover at positions distant from the holders and locally press an edge of the board, and the pedestals are formed to locally support the edge of the board.

In the housing case the pedestals are formed to support the edge of the board at positions other than corners.

In the housing case, the pressing members are formed to press the edge of the board at corners.

In the housing case according to the third embodiment, the convex (cover convex 244) is an end edge of the cover.

In the housing case according to the first to third embodiments, a distance (L2) between the pedestal and the holder is set to be identical or substantially identical with thickness (T) of the board when the cover is attached to the case body.

In the housing case, the adhesive member is adhesive agent (32).

In the housing case, the fixing members include a screw (36), a screw hole (38) bored in the case body, and a screw through-hole (50) bored in the cover, and the screw is inserted into the screw hole through the screw through-hole and tightened to fix the cover to the case body such that the board is fixed between the pedestal and the holder.

The housing case, the recess (cover recess 30, 230) is formed at an upper portion of a side surface (12S) of the case body along entire circumference of the case body.

The housing case further includes a positioning pin (24) formed at the case body and a positioning through-hole (positioning hole 60) bored at the board through which the positioning pin is inserted.

It should be noted that, although the expressions of "bottom surface," "side surface," "upward," "downward," etc., are used in the foregoing, they are expressed based on the directions in the drawing, and do not mean the directions with respect to the housing case 10 in the actual space.

It should also be noted that, although the third embodiment is configured as an alternative pattern of the first embodiment, the configuration of the third embodiment can be applied to the housing case according to the second embodiment.

It should also be noted that, although the materials of the case body 12 and cover 14, the predetermined amount L1, etc., are indicated with specific names and value, they are only examples and not limited thereto.

Japanese Patent Application Nos. 2008-276081 and 2008-276082, both filed on Oct. 27, 2008, are incorporated herein in its entirety.

While the invention has thus been shown and described with reference to specific embodiments, it should be noted that the invention is in no way limited to the details of the described arrangements; changes and modifications may be made without departing from the scope of the appended claims.

What is claimed is:

1. A housing case for housing an electronic circuit board on which components are mounted, comprising:
   a case body adapted to form a space that houses the board;
   a cover adapted to form the space with the case body;
   a pedestal formed on the case body to support the board;
   a holder formed on the cover at a location to face the pedestal to hold the board from opposite side of the pedestal;
   a recess formed at the case body near the pedestal;
   an adhesive member applied to the recess;
   a convex formed on the cover at a position corresponding to the recess; and
   a movement restriction member continuously formed at a position between the holder and the convex on the cover to restrict movement of the board;
   wherein the convex is inserted in the recess to be adhered by the adhesive member to attach the cover to the case body; and
   the movement restriction member is provided with an inclined surface that is formed at a position between the holder and the convex so as to contact the board such that a gap is formed among the inclined surface, the board and the case body.

2. The housing case according to claim 1, wherein an open end of the recess is formed to be lower than the pedestal by a predetermined amount.

3. The housing case according to claim 1, further including:
a plurality of fixing members that fix the board between the pedestal and the holder.

4. The housing case according to claim 1, wherein the convex is an end edge of the cover.

5. The housing case according to claim 1, wherein a distance between the pedestal and the holder is set to be identical or substantially identical with thickness of the board when the cover is attached to the case body.

6. The housing case according to claim 1, wherein the adhesive member is an adhesive agent.

7. The housing case according to claim 3, wherein the fixing members include a screw, a screw hole bored in the case body, and a screw through-hole bored in the cover, and the screw is inserted into the screw hole through the screw through-hole and tightened to fix the cover to the case body such that the board is fixed between the pedestal and the holder.

8. The housing case according to claim 1, wherein the recess is formed at an upper portion of a side surface of the case body along entire circumference of the case body.

9. The housing case according to claim 1, further including a positioning pin formed at the case body and a positioning through-hole bored at the board through which the positioning pin is inserted.

* * * * *